(12) United States Patent
Ono et al.

(10) Patent No.: US 7,907,650 B2
(45) Date of Patent: Mar. 15, 2011

(54) LASER MODULE, CONTROL METHOD OF THE SAME, CONTROL DATA OF THE SAME, AND CONTROL DATA GENERATION METHOD

(75) Inventors: Haruyoshi Ono, Yamanashi (JP); Isao Baba, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 624 days.

(21) Appl. No.: 11/392,547

(22) Filed: Mar. 30, 2006

(65) Prior Publication Data

US 2006/0222025 A1 Oct. 5, 2006

(30) Foreign Application Priority Data

Mar. 31, 2005 (JP) ................................. 2005-105488

(51) Int. Cl.
*H01S 3/00* (2006.01)
(52) U.S. Cl. .................. 372/38.07; 372/29.011; 372/34; 372/38.02; 372/108
(58) Field of Classification Search ............. 372/29.011, 372/34, 38.02, 38.07, 108
See application file for complete search history.

(56) References Cited

U.S. PATENT DOCUMENTS

| 4,725,854 | A | * | 2/1988 | Ohtsuka et al. | ............... 347/247 |
| 6,807,199 | B2 | * | 10/2004 | Ono et al. | ........................ 372/20 |
| 6,922,423 | B2 | * | 7/2005 | Thornton | .................... 372/38.07 |
| 2001/0019562 | A1 | * | 9/2001 | Kai et al. | .......................... 372/20 |
| 2004/0264518 | A1 | * | 12/2004 | Chang | ...................... 372/29.021 |

FOREIGN PATENT DOCUMENTS

JP 5-312646 A 11/1993
JP 8-139395 A 5/1996

* cited by examiner

*Primary Examiner* — Minsun Harvey
*Assistant Examiner* — Joshua King
(74) *Attorney, Agent, or Firm* — Westerman, Hattori, Daniels & Adrian, LLP

(57) ABSTRACT

A laser module includes a semiconductor laser, an output optical system provided on an optical output side of the semiconductor laser, a temperature detecting element that detects a temperature of the output optical system; and an output controller that calculates a drive current to set an optical output intensity of the laser module at a desired value on the basis of temperature information obtained by the temperature detecting element, and outputs the drive current to the semiconductor laser.

19 Claims, 13 Drawing Sheets

LASER MODULE, CONTROL METHOD OF THE SAME, CONTROL DATA OF THE SAME, AND CONTROL DATA GENERATION METHOD

BACKGROUND OF THE INVENTION

1. Field of the Invention

This invention generally relates to laser modules, control methods of the same, control data, and control data generation methods, and more particularly, to a laser module that keeps an optical output intensity constant, a control method of the same, control data, and a method of generating the control data.

2. Description of the Related Art

In recent years, in the fields of optical communication and home appliances, semiconductor lasers are for use in various products. In particular, with respect to the laser module having a semiconductor laser, there is a need for maintaining a constant optical output intensity, output from the laser module.

A description will now be given of a semiconductor laser module having a wavelength locker (conventional art), which is used for optical communication, as an example of the conventional semiconductor laser module. The semiconductor laser module having the wavelength locker is a laser module that outputs a light having a given number of different wavelengths (lock points). There is a demand for outputting a given wavelength (lock point) at a given optical output intensity with accuracy. FIG. 1 is a block diagram showing the semiconductor laser module having the wavelength locker. FIG. 2 schematically shows a package from which a lid is partially removed.

A semiconductor laser 10 is provided on a substrate 38. A light output from the semiconductor laser 10 passes through an output optical system 12, and is then output to the outside of the module, which corresponds to an external output system 90. The substrate 38 shown in FIG. 1 corresponds to a reference numeral 86 in FIG. 2. The semiconductor laser 10 shown in FIG. 1 corresponds to a reference numeral 81 in FIG. 2. The output optical system 12 shown in FIG. 1 corresponds to a reference numeral 82 in FIG. 2. An optical output intensity 50 denotes an optical output from the module to the outside. The output optical system 12 is an optical apparatus provided between the semiconductor laser 10 to a light extracting portion. For example, in a case where the light extracting portion is an external optical system 90 connected with an optical fiber as shown in FIG. 2, there may be provided a lens that couples the semiconductor laser 10 and the external optical system 90 and a beam splitter for preventing the light reflection. However, in some cases, the beam splitter may not be used.

A temperature setting apparatus 32 sets the temperature of the semiconductor laser 10. As shown in FIG. 2, a thermoelectric coller (TEC) 88 is provided. The beam emitted to the rear side of the semiconductor laser 10, which is arranged on an opposite side of an optical output side, passes through a beam splitter 14 and is split into two. One of such split beam reaches a light receiving element 16, which corresponds to a reference numeral 85 shown in FIG. 2. At this time, a monitor optical intensity 52 is an optical intensity of the light that reaches the light receiving element 16. The monitor optical intensity 52 correlates with an output from the semiconductor laser 10. The light receiving element 16 outputs the monitor optical intensity 52 to an output controller 20, as monitor optical intensity information 62.

The output controller 20 externally obtains output control information 60, which represents a demand of the optical output intensity 50 desired by the user, and also obtains the monitor optical intensity information 62 from the light receiving element 16. The output controller 20 calculates a drive current 66 to be output to the semiconductor laser 10 with the output control information 60 and the monitor optical intensity information 62 so as to set the optical output intensity 50 at a desired value. The drive current 66 is output to the semiconductor laser 10. Even if the output from the semiconductor laser 10 is changed, the optical output intensity 50 is kept constant. In this manner, Auto Power Control (APC) is to control the optical output intensity 50 at a desired value with the use of the monitor optical intensity information 62.

The other split beam reaches a wavelength detector 28. The wavelength detector 28 includes an etalon 24 and a light receiver 26. The beam that passes through the etalon 24 has a correlation value of wavelength—optical intensity. The light receiver 26 outputs the value having a correlation between wavelength and optical intensity that has passed the etalon 24, to a wavelength controller 30 as wavelength information 72.

With the use of the wavelength information 72, the wavelength controller 30 outputs setting temperature information 74 to the temperature setting apparatus 32 in order to set the wavelength at a desired value. This is accomplished by measuring, in advance, the wavelength information 72 and the setting temperature information 74 at the time when the desired wavelength is detected, prior to the shipment of the semiconductor laser module having the wavelength locker, and by providing a tuning table having the temperature setting information 74 that corresponds to the wavelength information 72. The temperature setting apparatus 32 sets the semiconductor laser 10 at a given temperature according to the temperature setting information 74. In this manner, according to the conventional art, the temperature of the semiconductor laser 10 is controlled to obtain a desired wavelength.

As described heretofore, according to the conventional art. Even if the temperature of the semiconductor laser 10 changes and the optical output from the semiconductor laser 10 changes, the light receiving element 16 receives a portion of the output from the semiconductor laser 10, and feedbacks the monitor optical intensity information 62 to the drive current 66 in order to obtain a desired wavelength, in other words, APC is accomplished. Thus, the optical output intensity can be stabilized at a given value.

As a method of correcting the change in the optical output intensity caused by the change in the temperature of the module having the semiconductor laser, there are additional conventional arts. One example is disclosed in Japanese Patent Application Publication No. 5-312646, in which a laser module having a semiconductor laser that detects the temperature of an etalon and corrects the wavelength. Another example is disclosed in Japanese Patent Application Publication No. 8-139395, in which a laser module having a semiconductor laser that detects the temperature of the semiconductor laser to prevent the change of a laser beam output intensity due to the temperature of the semiconductor laser or ambient temperature.

The conventional arts, however, have the problem in that the optical output intensity of a desired value is not available. FIG. 3 is a graph showing the afore-mentioned problem. In FIG. 3, the horizontal axis represents the output wavelength, and the vertical axis represents the optical output intensity. As described, according to the conventional arts, the wavelength is controlled by controlling the temperature of the semiconductor laser 10. That is to say, the wavelength on the horizontal axis corresponds to the temperature. Although the monitor optical intensity 52 controls the output from the semiconductor laser 10 (APC control), the optical output intensity 50 changes as the wavelength changes, in other words, the temperature changes. Under such circumstances, the semiconductor laser module cannot serve as a high-quality one for use in optical communication.

SUMMARY OF THE INVENTION

The present invention has been made in view of the above circumstances and provides a laser module, a control method of the same, control data, a generation method of the control data, in which an optical output intensity does not change, even if the temperature of a semiconductor laser or the laser module changes.

According to one aspect of the present invention, preferably, there is provided a laser module including: a semiconductor laser; an output optical system provided on an optical output side of the semiconductor laser; a temperature detecting element that detects a temperature of the output optical system; and an output controller that calculates a drive current to set an optical output intensity of the laser module at a desired value on the basis of temperature information obtained by the temperature detecting element, and outputs the drive current to the semiconductor laser. In accordance with the present invention, the output optical system distorts due to the change in the temperature of the semiconductor laser or the module thereof. Accordingly, by correcting the afore-described change, it is possible to provide a laser module in which the optical output intensity does not change, even if the temperature of the semiconductor laser or the laser module having the semiconductor laser changes.

According to another aspect of the present invention, preferably, there is provided a control method of a laser module including a semiconductor laser, an output optical system provided on an optical output side of the semiconductor laser, and a temperature detecting element that detects a temperature of the output optical system, the control method comprising the steps of: detecting the temperature of the output optical system; calculating a drive current to set an optical output intensity of the laser module at a desired value with temperature information that corresponds to the temperature of the output optical system; and driving the semiconductor laser with the drive current. In accordance with the present invention, the output optical system distorts due to the change of the temperature in the semiconductor laser or the module thereof, and the optical output intensity changes. It is possible to provide the control method of the laser module in which the optical output intensity does not change by correcting the change, even if the temperature of the semiconductor laser or the laser module having the semiconductor laser changes.

According to another aspect of the present invention, preferably, there is provided a generation method of control data including a semiconductor laser, an output optical system provided on an optical output side of the semiconductor laser, a temperature detecting element that detects a temperature of the output optical system, and a light receiving element that detects a monitor optical intensity, the control method including the steps of: controlling an optical output to keep the monitor optical intensity constant on the basis of information on the monitor optical intensity obtained from the light receiving element; measuring a change amount of an optical output intensity output from the output optical system before and after the temperature of the output optical system changes, in a state where the step of controlling the optical output is implemented; and obtaining optical output intensity correction information that is the control data to correct a difference in the optical output intensity before and after the temperature of the output optical system changes, with the information on the change amount of the optical output intensity measured. In accordance with the present invention, the output optical system distorts due to the change of the temperature in the semiconductor laser or the module thereof, and the optical output intensity changes. It is possible to provide the generation method of the control data to control the laser module in which the optical output intensity does not change by correcting the change, even if the temperature of the semiconductor laser or the laser module having the semiconductor laser changes.

According to another aspect of the present invention, preferably, there is provided a generation method of control data to control a laser module including a semiconductor laser, an output optical system provided on an optical output side of the semiconductor laser, and a temperature detecting element that detects a temperature of the output optical system, the generation method including: calculating a change in an optical loss of the output optical system before and after the temperature of the output optical system changes, on the basis of a physical constant of the output optical system; and obtaining optical output intensity correction information that is the control data to correct a difference in an optical output intensity before and after the temperature of the output optical system changes, with the information on the change in the optical loss calculated.

According to another aspect of the present invention, preferably, there is provided a generation method of control data to control a laser module including a semiconductor laser, an output optical system provided on an optical output side of the semiconductor laser, and a temperature detecting element that detects a temperature of the output optical system, the generation method including: obtaining a change amount of an outer shape of the output optical system before and after the temperature of the output optical system changes; calculating a change in an optical loss of the output optical system before and after the temperature of the output optical system changes, on the basis of information on the change amount obtained; and obtaining optical output intensity correction information that is the control data to correct a difference in an optical output intensity before and after the temperature of the output optical system changes, with the information on the change in the optical loss calculated. In accordance with the present invention, it is possible to shorten the period for generating the control data.

According to another aspect of the present invention, preferably, there is provided control data to control a laser module including a semiconductor laser, an output optical system provided on an optical output side of the semiconductor laser, and a temperature detecting element that detects a temperature of the output optical system, the control data including optical output intensity correction information that is the control data to correct a difference in an optical output intensity before and after the temperature of the output optical system changes, on the basis of a change in an optical loss of the output optical system.

According to another aspect of the present invention, preferably, there is provided a semiconductor laser including: a semiconductor laser; an output optical system provided on an optical output side of the semiconductor laser; and a temperature detecting element that detects a temperature of the output optical system.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

The inventors of the present invention carried out an experiment, as described below, in order to find the reason why the optical output intensity 50 changes, according to the change in the temperature of the semiconductor laser 10 or the like, although the above-described APC (the output of the semiconductor laser is controlled to be constant according to the monitor light intensity) is implemented.

Figure 4:
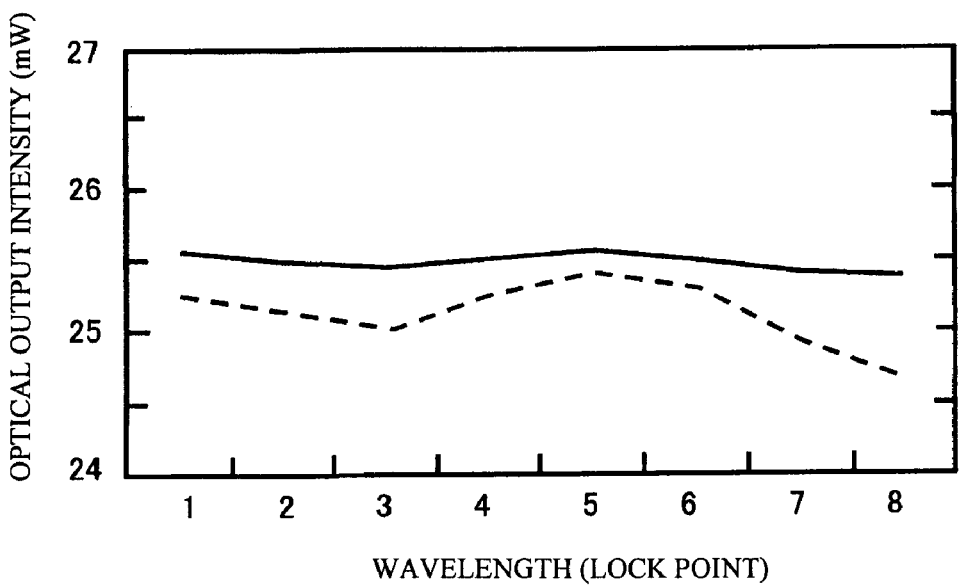
FIG. 4 is a graph showing the optical output intensity and output wavelength (temperature) of the semiconductor laser module of the conventional art, when the optical output intensity is controlled with a portion of the light emitted from the output optical system used as a monitor optical intensity.

The above-described conventional semiconductor laser module having the wavelength locker that has been described was used, so the optical output intensity 50 was controlled with a portion of the light output from the output optical system 12 used as the monitor light intensity. FIG. 4 is a graph showing results of the experiment. The horizontal axis represents the lock point that corresponds to the wavelength, and the vertical axis denotes the optical output intensity. The dashed line indicates the optical output intensity of the conventional art, and the continuous line indicates the optical output intensity that has been obtained in the present experiment. As shown in FIG. 4, unlike the conventional art, the results of the present experiment has a constant optical output intensity.

Figure 1:
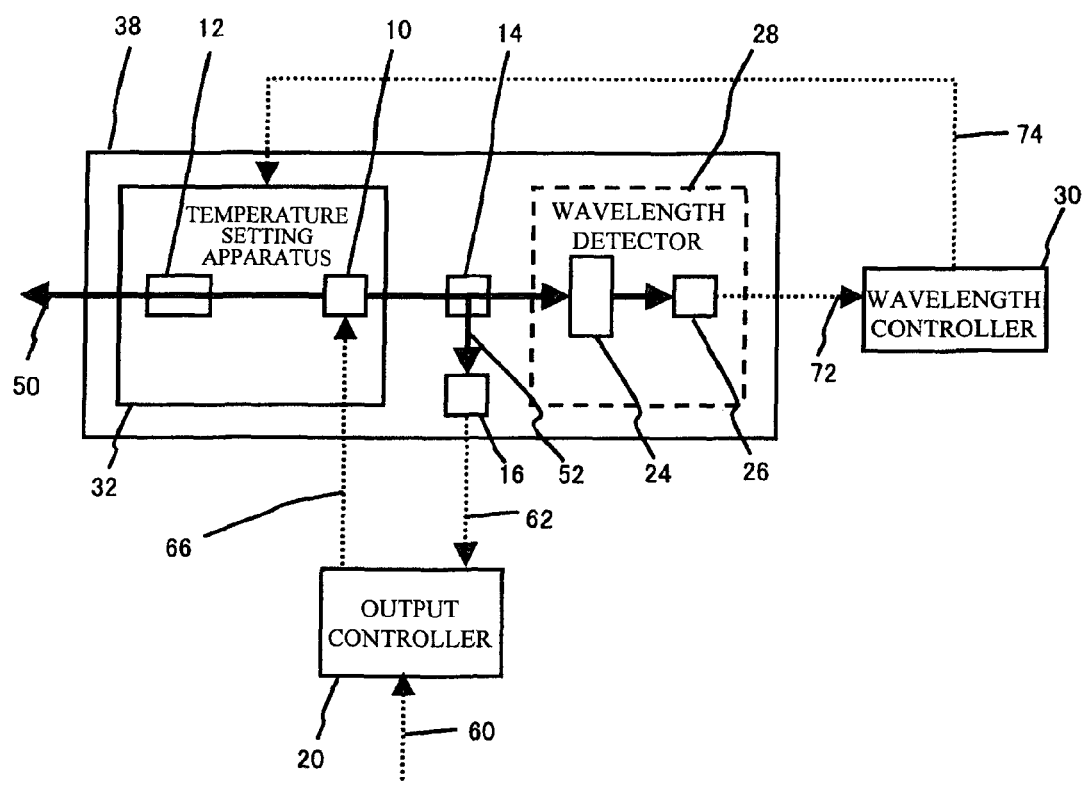
FIG. 1 is a block diagram showing a semiconductor laser module having a wavelength locker of the conventional art.
Figure 2:
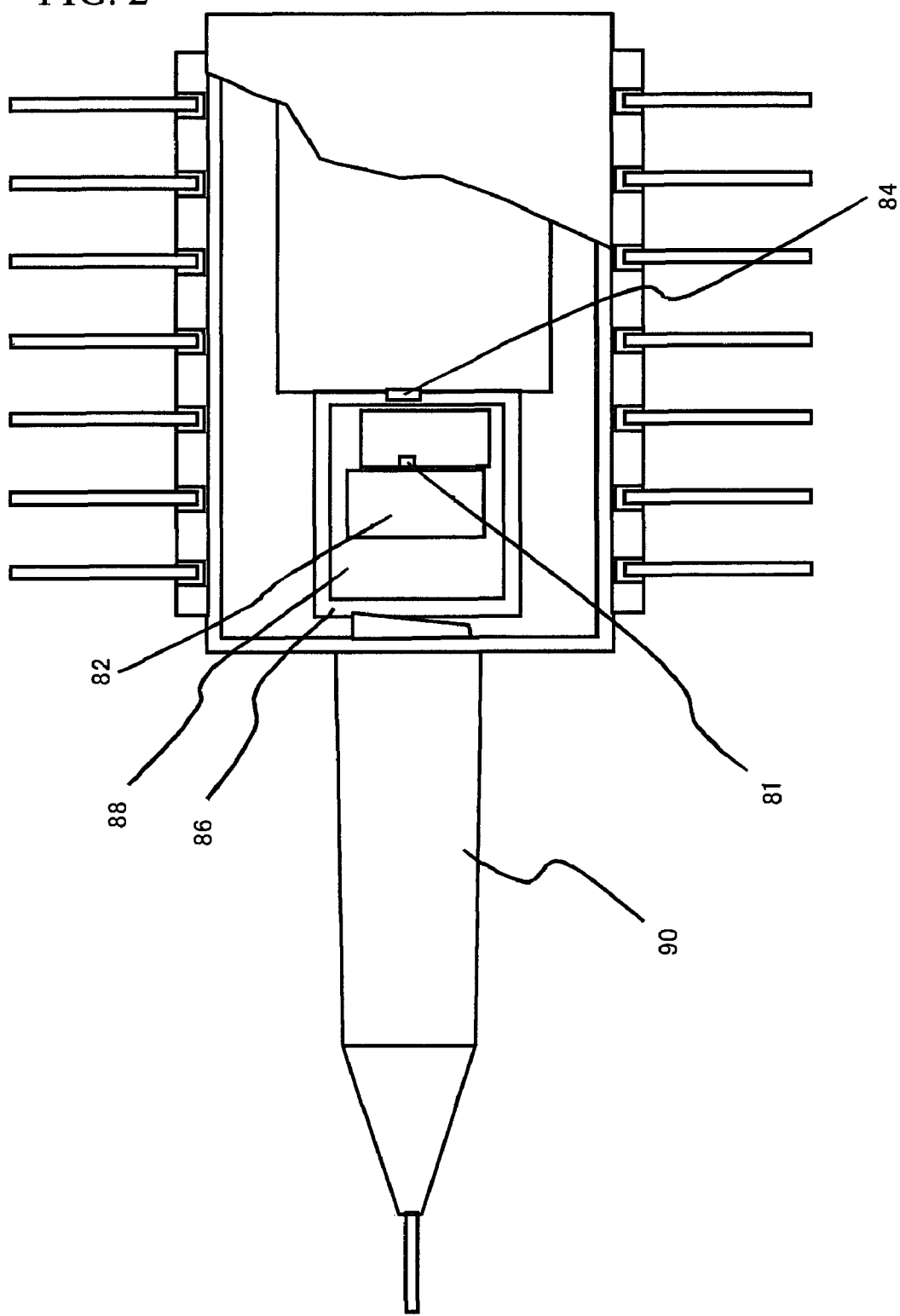
FIG. 2 schematically shows a package of semiconductor laser module of the conventional art from which a lid is partially removed.
Figure 3:
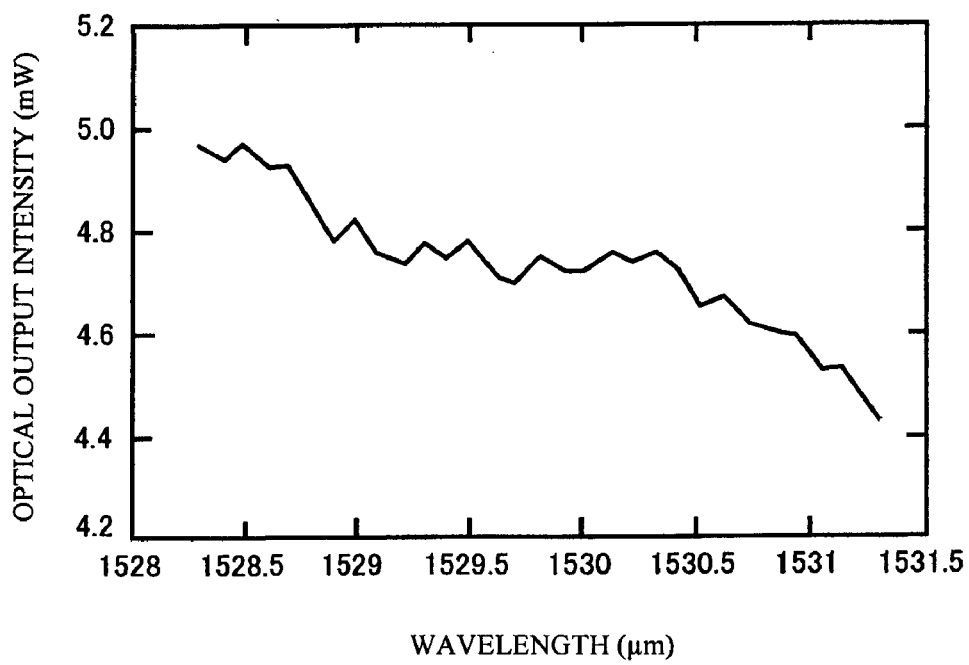
FIG. 3 is a graph showing an optical output intensity and output wavelength (temperature) of the semiconductor laser module of the conventional art.

From the results of the experiment, the following consideration will be given. As described above, in the semiconductor laser module having the wavelength locker, the wavelength is controlled by controlling the temperature of the semiconductor laser. The horizontal axis in FIG. 4 also corresponds to the temperature of the semiconductor laser. As shown in FIG. 1 and FIG. 2, the output optical system 12 (the reference numeral 82 in FIG. 2) is provided on the temperature setting apparatus 32 (TEC 88 in FIG. 2). Therefore, the temperature of the output optical system 12 changes, by changing the temperature of the semiconductor laser 10. According to the conventional arts, the monitor optical intensity 52 controls the drive current 66 of the semiconductor laser 10, and the output from the semiconductor laser 10 should be controlled to be constant. Nevertheless, The optical output intensity 50 from the output optical system 12 changes, when the wavelength changes in the conventional art, as indicated by the dashed line in FIG. 4, in other words, when the temperature changes.

Meanwhile, the optical output intensity is almost stable, even if the wavelength changes, that is, even if the temperature changes, in the present experiment in which the output from the semiconductor laser 10 is controlled with a portion of the optical output intensity 50, as indicated by the continuous line in FIG. 4. This exhibits that the loss of the optical intensity that passes through the output optical system 12 changes, as the wavelength, namely, temperature changes. Referring back to FIG. 2, according to the conventional art, the output optical system 82 is welded to be secured onto the TEC 88 by YAG laser or the like. When the TEC 88 controls the temperature, a fixing portion of the output optical system 82 expands and contracts, and the output optical system 82 is physically distorted. Such distorted the output optical system 82 appears as a change in the optical coupling with the external output system 90, and the optical output intensity 50 of the laser module changes.

In order to keep the optical output intensity 50 constant, even if the wavelength changes, that is to say, the temperature changes, it is only necessary to control the output from the semiconductor laser, while monitoring a portion of the optical output intensity 50 output to the external optical system. However, a large-scale system is needed for monitoring a portion of the optical output intensity 50 that is externally output.

Accordingly, in the present invention, the drive current of the semiconductor laser is corrected to drive the semiconductor laser, with temperature information that corresponds to the temperature of the output optical system. In addition, a correction table stores, in advance, optical output intensity correction information that corresponds to the temperature information. This makes it possible to correct the drive current and to drive the semiconductor laser, with the optical output correction information and temperature information at the time of operation.

First Embodiment

Figure 5:
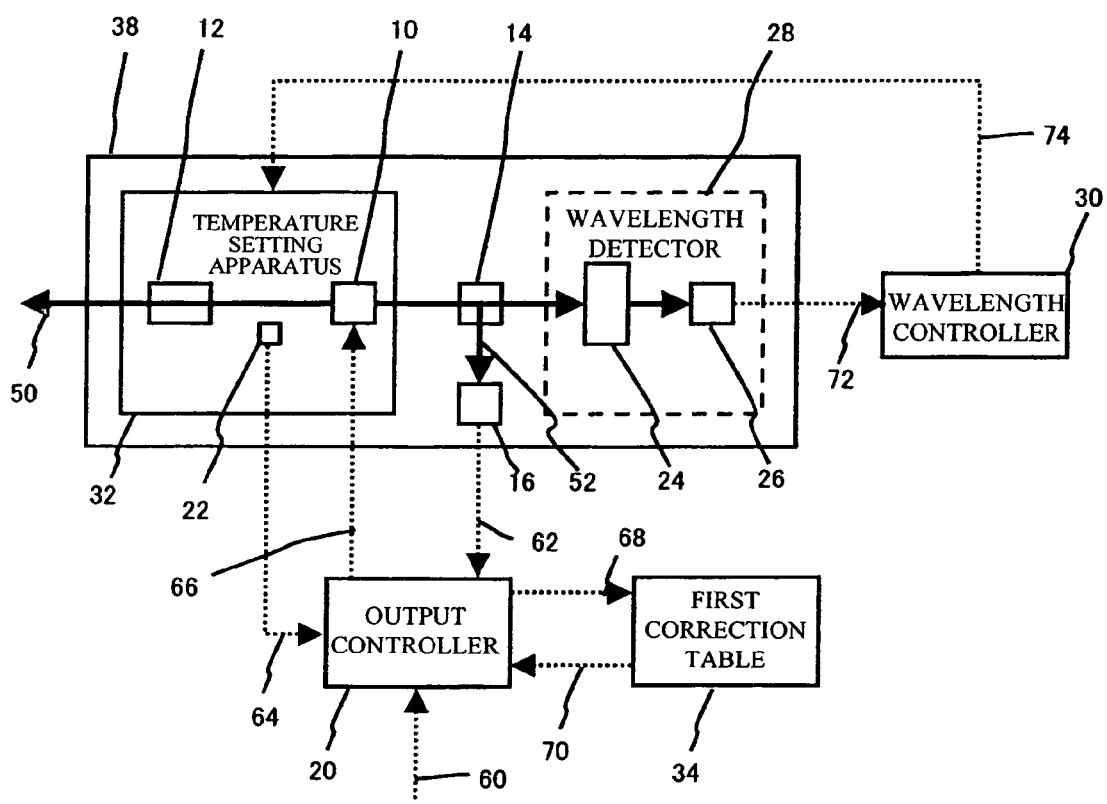
FIG. 5 is a block diagram of the semiconductor laser in accordance with a first embodiment of the present invention.

A semiconductor module in accordance with a first embodiment of the present invention will be exemplarily described. The semiconductor module in accordance with the first embodiment of the present invention has a wavelength locker that monitors a monitor optical intensity in the rear side (the opposite side of the optical output side) of the semiconductor laser. FIG. 5 is a block diagram of the semiconductor laser in accordance with the first embodiment of the present invention. There are additionally provided a temperature detecting element 22, a first correction table 34, and a transmitting and receiving mechanism between the first correction table 34 and the output controller 20. The temperature detecting element 22 detects the functionality of the output controller 20 and temperature of the output-optical system 12. Hereinafter, in the first embodiment, the same components and configurations as those of the conventional art have the same reference numerals. That is to say, the semiconductor module in accordance with the first embodiment includes the semiconductor laser 10, the temperature detecting element 22 that detects the temperature of the output optical system 12, and the light receiving element 16 that detects the monitor optical intensity 52 that corresponds to the optical output from the semiconductor laser 10. The light receiving element 16 receives the light output to the rear side (the opposite side of the optical output side) of the semiconductor laser 10. The light receiving element 16 also receives the split beam by the beam splitter 14.

The output controller 20 externally obtains the output control information 60, which is a request for the optical output intensity desired by the user. The output controller 20 also obtains temperature information 64 from the temperature detecting element and the monitor optical intensity information 62 from the light receiving element 16. The output controller 20 further obtains optical output intensity correction information 70 that corresponds to temperature information 68 from the first correction table 34. The output controller 20 calculates the drive current 66 so that the optical output intensity 50 of the laser module is set to a desired value (that corresponds to the output control information 60) with the use of the monitor optical intensity information 62 and the optical output intensity correction information 70 (in other words, on the basis of the temperature information). Then, the drive current 66 is output to the semiconductor laser 10. The semiconductor laser 10 outputs the beam that corresponds to the drive current 66.

The temperature detecting element 22 may be secured onto the substrate 38 to which the output optical system 12 is secured. Alternatively, the temperature detecting element 22 may be provided in the vicinity of the output optical system 12. In the vicinity of the output optical system 12, it is preferable that the temperature detecting element 22 should be arranged closer to the output optical system 12 than to the semiconductor laser 10. It is thus possible to detect the temperature of the output optical system 12 more accurately. Also, it is possible for the temperature detecting element 22 to serve as an element that detects the temperature of the semiconductor laser 10. This makes it possible to reduce the number of the temperature detectors and to reduce the production costs.

Next, a description will be given of a control method of the laser module in accordance with the first embodiment. First, the temperature detecting element 22 detects the temperature of the output optical system 12, and outputs the temperature information 64 that corresponds to the temperature detected by the output controller 20. The output controller 20 obtains the temperature information 64 from the temperature detecting element 22. The light receiving element 16 detects the monitor optical intensity 52 that corresponds to the optical output from the semiconductor laser 10, and outputs the monitor optical intensity information 62 that corresponds to the monitor optical intensity 52 to the output controller 20.

The temperature detecting element 22 detects the temperature of the output optical system 12. The output controller 20 obtains the temperature information 64 from the temperature detecting element 22, and obtains the monitor optical intensity information 62 from the light receiving element 16. In addition, the output controller 20 obtains the optical output intensity correction information 70 that corresponds to the temperature information 68 from the first correction table 34. The output controller 20 calculates the drive current 66 to set the optical output intensity of the semiconductor laser 10 to a desired value (at a step of calculating the drive current), with the use of the optical output intensity correction information 70 and the monitor optical intensity information 62 (in other words, the temperature information 64 and the monitor optical intensity information 62). The output controller 20 outputs the drive current 66 to the semiconductor laser 10. The semiconductor laser 10 outputs the light having the intensity that corresponds to the drive current 66. That is to say, the drive current 66 drives the semiconductor laser 10.

Here, the temperature information includes current, voltage, or another type of signal that corresponds to the temperature detected by the temperature detecting element 22. The monitor optical intensity information includes current, voltage, or another type of signal that corresponds to the monitor optical intensity detected by the light receiving element 16.

Figure 6:
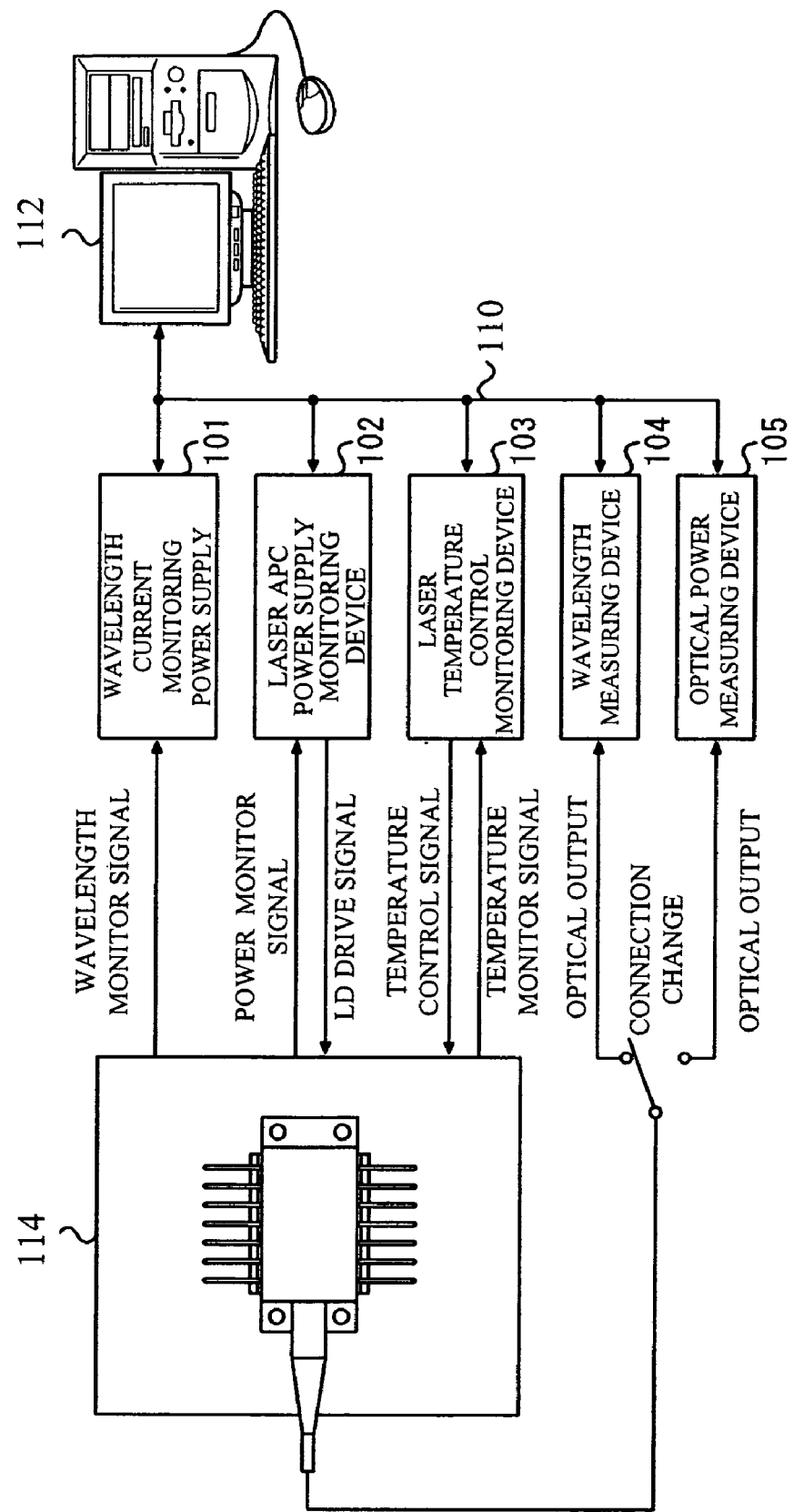
FIG. 6 is a view illustrating a configuration of devices that generate a first correction table.

Next, a description will be given of a generation method of control data included in the first correction table. FIG. 6 is a view illustrating a configuration of devices that generate the first correction table. There are connected a wavelength current monitoring power supply 101, a laser APC power supply monitoring device 102, a laser temperature control monitoring device 103, a wavelength measuring device 104, and an optical power measuring device 105. The wavelength current monitoring power supply 101 receives a wavelength monitoring signal from a semiconductor laser module (LD module) 114. The laser APC power supply monitoring device 102 receives a power monitoring signal from the LD module 114, and sends an LD drive signal. The laser temperature control monitoring device 103 receives a temperature monitoring signal from the LD module 114, and sends a temperature control signal. The wavelength measuring device 104 receives the optical output from the LD module 114. The afore-described monitoring devices and measuring devices are controlled by a computer (operating portion) 112 for measurement control, with the use of a GPIB 110 for measurement instrument control.

The wavelength monitoring signal corresponds to wavelength information 72 output from the wavelength detector 28 of the semiconductor laser module. The power monitoring signal corresponds to the monitor optical intensity information 62 output from the light receiving element 16. The LD drive signal corresponds to the drive current 66. The temperature monitoring signal corresponds to the temperature information 64 output from the temperature detecting element 22. The temperature control signal corresponds to the setting temperature information 74.

The optical output is coupled to the optical power measuring device 105 (namely, an optical power measuring device) to implement APC control. That is to say, the monitor optical intensity 52 is controlled to be constant on the basis of the monitor optical intensity information 62 that corresponds to the monitor optical intensity 52 (a step for controlling the optical output).

In a state where the step for controlling the optical output is implemented, the laser temperature control monitoring device 103 outputs a temperature control signal (namely, the setting temperature information) to change the temperature of the output optical system 12 (a step for setting the temperature). At this time, the temperature can be set by use of the temperature setting apparatus 32. This makes it possible to simplify a measuring system that generates the correction table. The optical power measuring device 105 measures the optical output intensity output from the output optical system 12, before and after the temperature changes. In this manner, a change amount of the optical output intensity that is output from the output optical system 12 is obtained (a step for measuring the optical output), before and after the temperature of the output optical system 12 changes. The computer (operating portion) 112 for measurement control obtains the optical output intensity correction information that is the control data for correcting the difference in the optical output intensity before and after the temperature of the output optical system 12 changes, with the use of the information on such obtained change amount of the optical output intensity (a step for calculating the optical output intensity correction information). The correction table is generated for the temperature information that corresponds to the temperature of the output optical system 12 and the optical output intensity correction information (a step for generating the correction table). In this manner, the first correction table is created for the temperature information and the optical output intensity correction information.

For example, at the step for calculating the optical output intensity correction information, the optical output intensity correction information can be set as a "difference in the optical output intensity" between a desired optical output intensity of the laser module and that measured at the step for measuring the optical output intensity. In the afore-mentioned case, at the step for calculating the drive current when the laser module is controlled, the output controller 20 adds the correction for the current drive that corresponds to the "difference in the optical output intensity" that is the optical output intensity correction information, to the drive current output by APC, so that the drive current can be calculated. It is thus possible to obtain the optical output intensity of the laser module, in which the change in the optical loss caused by the temperature in the output optical system 12 is corrected.

In a case where the monitor optical intensity information 62 serves as a monitoring current of the light receiving element 16, the optical output intensity correction information 70 can be set as a ratio of the optical output intensity to the monitoring current, for example, at the step for calculating the optical output intensity correction information. In the afore-mentioned case, at the step for calculating the drive current while the laser module is being controlled, the output controller 20 is capable of calculating the drive current easily by multiplying the drive current that is output by APC by the ratio of the optical output intensity to the monitoring current.

Figure 7:
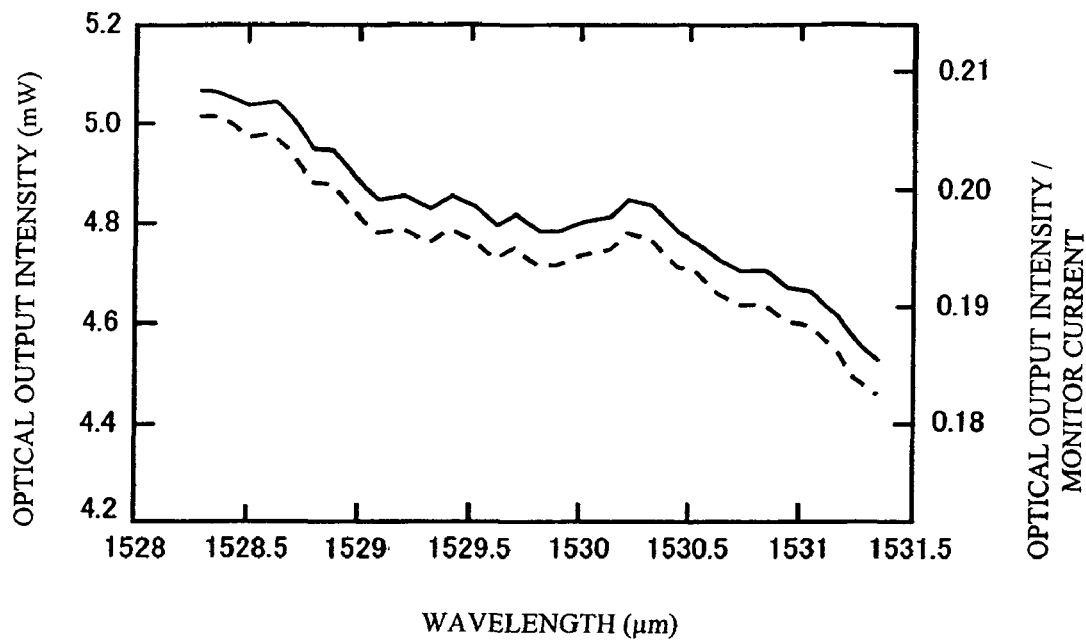
FIG. 7 is a graph showing an optical output intensity and a ratio of the optical output intensity to a monitoring current, which are obtained in advance.

FIG. 7 is a graph showing the optical output intensity and a ratio of the optical output intensity to the monitoring current, which are obtained in advance. The horizontal axis represents the optical wavelength (namely, temperature), and the vertical axis represents the optical output intensity (indicated by a dashed line) and the ratio of the optical output intensity to the monitoring current (the optical output intensity/monitoring current: indicated by the continuous line).

Figure 8:
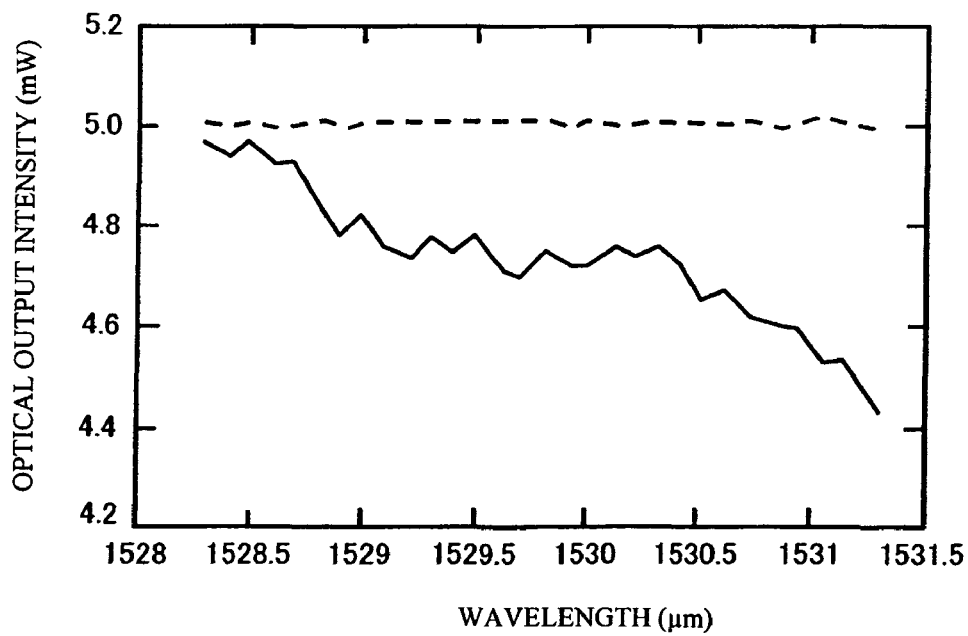
FIG. 8 is a graph showing the optical output intensity and the wavelength (namely, temperature)

FIG. 8 is a graph showing the optical output intensity and the wavelength (namely, temperature) in a case where the monitor optical intensity information 62 serves as a monitoring current of the light receiving element 16 and the optical output intensity correction information 70 is set to the ratio of the optical output intensity to the monitoring current. The continuous line indicates the conventional art, and the dashed line indicates the first embodiment. It is possible to reduce the change in the optical output intensity, when the wavelength changes (in other words, the temperature changes) in the laser module in accordance with the first embodiment, as compared to that of the conventional art.

It is possible to generate a correction table that includes the temperature information and the optical output intensity correction information at multiple stages, by repeating the step for setting the temperature to the step for calculating the optical output intensity correction information. In the semiconductor laser module having the wavelength locker, it is only necessary to generate the correction table at the temperature that corresponds to the lock point.

The step for setting the temperature to the step for calculating the optical output intensity correction information are repeated twice or more, and at the step for generating the correction table, it is possible to generate the correction table by an interpolation method for the optical output intensity correction information that corresponds to the temperature that is not set at the step for setting the temperature. That is to say, multiple pieces of the optical output intensity correction information are obtained for respectively different temperatures of the output optical system 12. The optical output intensity correction information of the temperatures between the different temperatures is also created by the interpolation method. This makes it possible to reduce the measurement numbers for creating the correction table, thereby enabling the time for generating the correction table to be shortened. A single interpolation method that linearly interpolates is an easy method. However, the multiple interpolation method or another interpolation method may be used for a more accurate calculation.

For example, the step for setting the temperature to the step for calculating the optical output intensity correction information is repeated twice for an upper limit temperature and a lower limit temperature. The operating portion (the computer for measurement control) 112 calculates the temperature information and the optical output intensity correction information of an unmeasured temperature by the single interpolation method on the basis of the temperature information of the upper limit temperature and the lower limit temperature and the optical output intensity correction information that corresponds to the temperature information, so the correction table can be generated.

In addition, the step for controlling the optical output to the step for generating the correction table need not to be implemented on all laser modules. One or more laser module out of the laser modules to be used may create the correction table. That is to say, the optical output intensity correction information is obtained only from a given laser module out of the laser modules that utilize the correction information. This enables the time for creating the correction table to be shortened.

Further, the operating portion 112 calculates the distortion of the output optical system 12 when the temperature changes, with a physical constant of the output optical system 12 and that of the substrate 38 such as a coefficient of thermal expansion, Young's modulus, or the like, and further calculates the optical loss in the output optical system 12. This makes it possible to generate the correction table of the optical output intensity correction information that corresponds to the temperature information.

That is to say, first, the change in the optical loss of the output optical system 12 is calculated, before and after the temperature of the output optical system 12 changes, on the basis of the physical constant of the output optical system 12. From the information on the change in such calculated optical loss, the optical output intensity correction information that is the control data for correcting the difference in the optical output intensity is obtained before and after the temperature of the output optical system 12 changes. Then, the correction table of the temperature information of the setting temperature and the optical output intensity correction information is created. This enables the time for creating the correction table to be shortened.

The distortion of the output optical system 12 when the temperature changes is obtained as a displacement amount of an outer shape of the output optical system 12, with the use of an image detection technique that utilizes a known laser displacement gauge or camera of triangle distance measurement. The operating portion uses the distortion to calculate the optical loss of the output optical system 12. This makes it possible to create the correction table of the optical output intensity correction information that corresponds to the temperature information.

In other words, first, the temperature of the output optical system 12 is changed, and the displacement amount of the outer shape of the output optical system 12 is obtained before and after the change. Next, from such calculated information on the change in the optical loss, the change in the optical loss of the output optical system 12 is calculated before and after the temperature is changed. From such calculated information on the change in the optical loss, the optical output intensity correction information that is the control data for correcting the difference in the optical output intensity before and after the temperature of the output optical system 12 changes. Lastly, the correction table for the temperature information and the optical output intensity correction information of the setting temperature is created. This enables the time for creating the correction table to be shortened.

The first correction table, namely, the control data that is corrected in the method described heretofore includes the optical output intensity correction information that is the control data for correcting the difference in the optical output intensity, on the basis of the optical loss in the output optical system 12. The control data includes the information on the optical output intensity correction at multiple temperatures between the upper limit temperature and the lower limit temperature of the laser module. In addition, in the control data, multiple temperatures are determined to control the laser module, and the optical output intensity correction information is provided for such determined respective temperatures. The control data is stored in a memory storage medium such as a memory IC, floppy disk, or the like. The control data may be stored in a specific memory IC, for example, a memory IC in a semiconductor laser module into which writing is allowed. This makes it possible to prevent of the misuse by mistaking for another correction table of another semiconductor laser module.

As described heretofore, in the semiconductor laser module having the locker in accordance with the first embodiment, the first correction table 34 stores the temperature information 64 that corresponds to the temperature of the output optical system and the optical output intensity correction information 70 that corresponds to the temperature information, in advance. At the time of operation, the output controller 20 obtains the optical output intensity correction information 70 that corresponds to the temperature information 64 of the output optical system 12, calculates the drive current 66 to be output to the semiconductor laser 10, and outputs the drive current 66 to the semiconductor layer 10. This makes it possible to obtain a constant optical output intensity, even if the temperature (wavelength) changes.

Second Embodiment

A second embodiment of the present invention exemplarily describes an improved one in accordance with the first embodiment of the present invention. In the first embodiment, the optical output intensity has to be corrected due to the change in the temperature, because there exists the problem described below.

Figure 9:
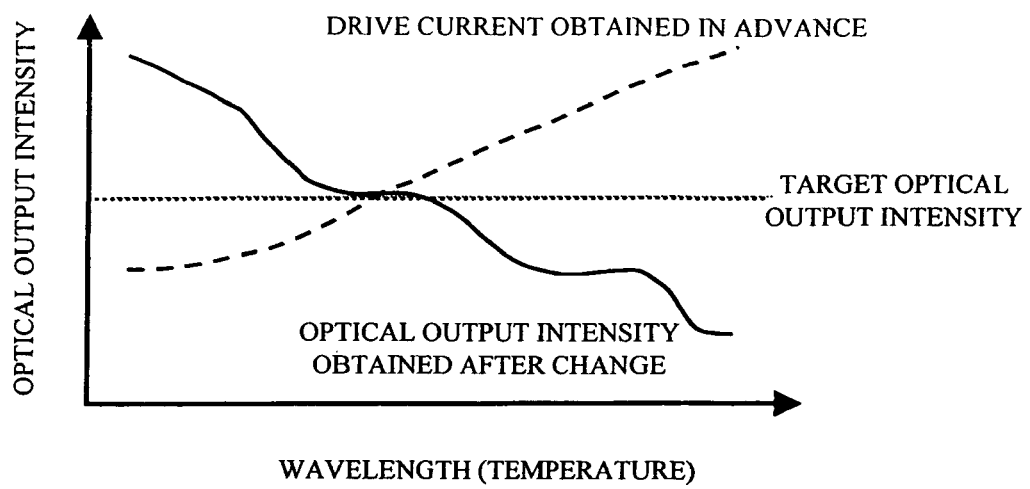
FIG. 9 is a (first) graph showing relationship between the optical output intensity and the wavelength (temperature) in the semiconductor laser module in accordance with the first embodiment of the present invention, when the afore-mentioned semiconductor laser module is controlled.
Figure 10:
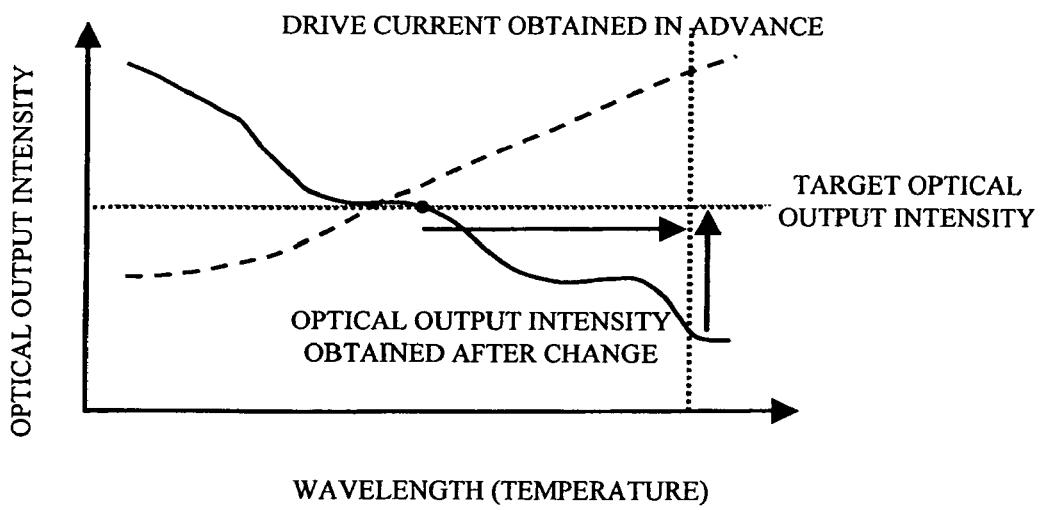
FIG. 10 is a (second) graph showing relationship between the optical output intensity and the wavelength (temperature) in the semiconductor laser module in accordance with the first embodiment of the present invention, when the afore-mentioned semiconductor laser module is controlled.
Figure 11:
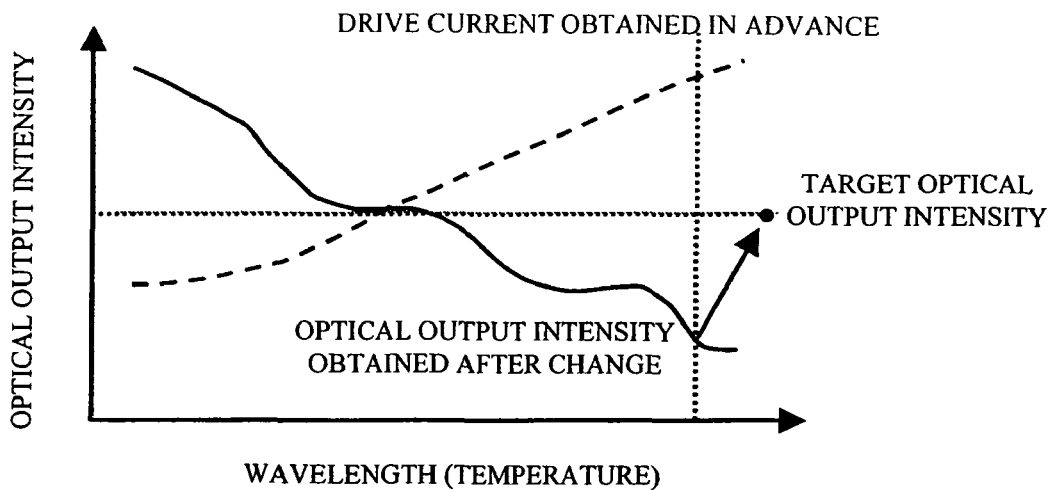
FIG. 11 is a (third) graph showing relationship between the optical output intensity and the wavelength (temperature) in the semiconductor laser module in accordance with the first embodiment of the present invention, when the afore-mentioned semiconductor laser module is controlled.

FIG. 9 schematically shows the relationship between the drive current and the wavelength (namely, temperature), obtained in advance before the optical output intensity is corrected by the temperature information (namely, the conventional art). The continuous line indicates the optical output intensity obtained before correction, the long dashed line indicates the drive current before correction, and the short dashed line indicates the desired optical output intensity. Referring now to FIG. 10, when the temperature is changed (as indicated by an arrow in a lateral direction) in order to obtain a desired wavelength, the optical output intensity changes (for example, decreases) owning to the distortion of the output optical system 12. Accordingly, as shown in the arrow in the lateral direction in FIG. 10, the corrected drive current, which is corrected by the control method in accordance with the first embodiment is employed, is output to the semiconductor laser 10. However, referring now to FIG. 11, the wavelength (temperature) deviates from the desired value (as shown in an arrow in FIG. 11). This is because the drive current is changed (for example, increased) so as to change the optical output intensity (for example, increase), thereby changing the refractive index in the semiconductor laser 10 and the wavelength.

Figure 12:
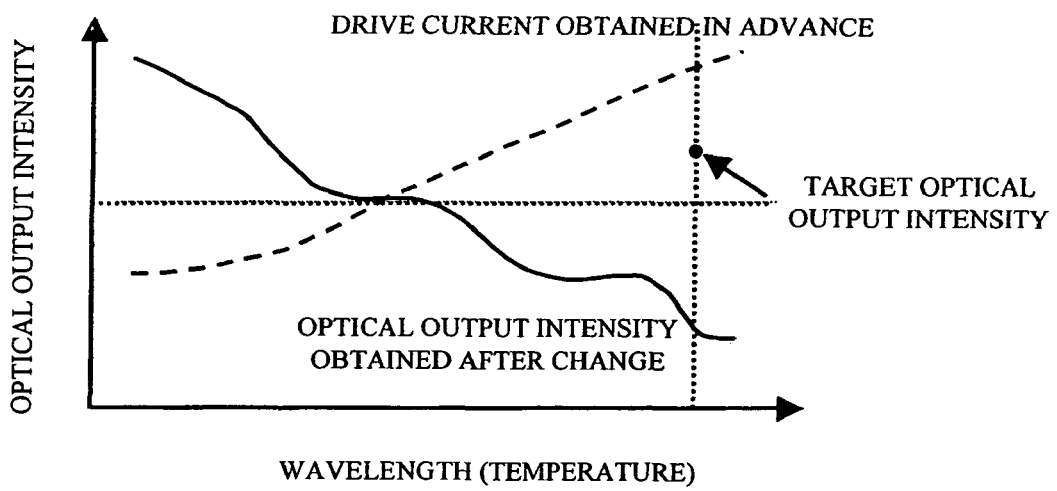
FIG. 12 is a (fourth) graph showing relationship between the optical output intensity and the wavelength (temperature) in the semiconductor laser module in accordance with the first embodiment of the present invention, when the afore-mentioned semiconductor laser module is controlled.
Figure 13:
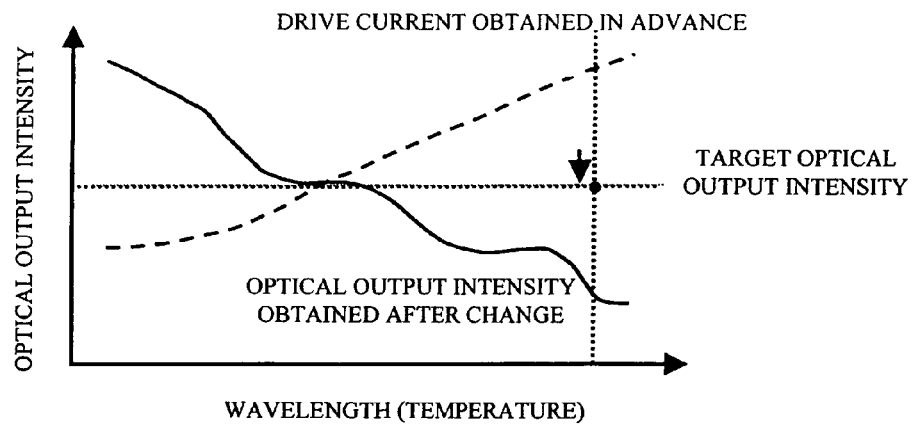
FIG. 13 is a (fifth) graph showing relationship between the optical output intensity and the wavelength (temperature) in the semiconductor laser module in accordance with the first embodiment of the present invention, when the afore-mentioned semiconductor laser module is controlled.

Referring now to FIG. 12, therefore, the setting temperature is changed again to match the wavelength. Nevertheless, the optical output intensity changes again (as shown in an arrow in FIG. 12) due to the changed temperature. Subsequently, referring to FIG. 13, the drive current is corrected by the control method in accordance with the first embodiment to obtain the desired optical output intensity (as shown in an arrow in FIG. 13). In this manner, complex steps are necessary.

Figure 14:
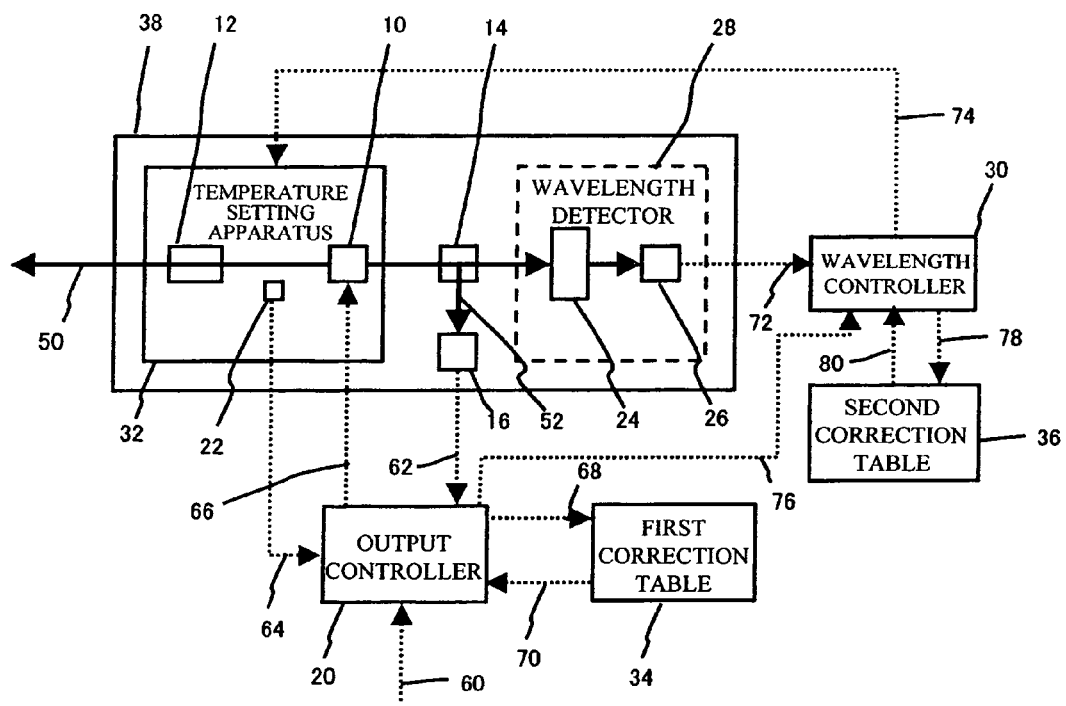
FIG. 14 is a block diagram of the semiconductor laser module in accordance with the second embodiment of the present invention.

To address the afore-described problem, the laser module in accordance with the second embodiment additionally includes a second correction table having wavelength correction information that corresponds to drive current change information, in addition to the configuration of the laser module in accordance with the first embodiment. Here, the drive current change information denotes the information showing a change amount (correction amount) of the drive current that is corrected by the control method in accordance with the first embodiment. In other words, the drive current change information denotes the information that corresponds to the change in the drive current 66 that the output controller 20 outputs to the semiconductor laser 10. The second correction table stores the change amount of the wavelength of the semiconductor laser, which is generated by the afore-described drive current. The wavelength correction information denotes a wavelength change amount (change amount in the wavelength) that corresponds to the change (namely, correction current change information) in the drive current 66 of the semiconductor laser. FIG. 14 is a block diagram of the semiconductor laser in accordance with the second embodiment of the present invention. There are additionally provided a second correction table 36, an information transmitting and receiving mechanism between the second correction table 36 and wavelength controller 30, and another information transmitting and receiving mechanism between the output controller 20 and the wavelength controller 30. In the second embodiment, the same components and configurations as those of the semiconductor laser module in accordance with the first embodiment shown in FIG. 5 have the same reference numerals. The output controller 20 calculates the drive current 66 with the use of the monitor optical intensity information 62 and the optical output intensity correction information 70 in the control method in accordance with the first embodiment.

The wavelength controller 30 obtains drive current change information 76 from the output controller 20. The wavelength controller 30 obtains wavelength correction information 80 that corresponds to drive current change information 78 from the second correction table 36. At the time of calculating the setting temperature information 74, the wavelength controller 30 calculates the setting temperature information 74 in order to set the wavelength of the semiconductor laser 10 at a desired value with the use of the wavelength correction information 80 in addition to the wavelength information 72. That is to say, the setting temperature information 74 is calculated with the use of the wavelength information 72 and the wavelength correction information 80 in order to set the wavelength of the semiconductor laser 10 at a desired value. Subsequently, the setting temperature information 74 is output to the temperature setting apparatus 32, as described in the first embodiment.

The second correction table 36 may be included in a tuning table having the setting temperature information 74 that corresponds to the wavelength information 72 or in the first correction table 34 in accordance with the first embodiment.

A description will now be given of a control method of the wavelength of the semiconductor laser module having a wavelength locker in accordance with the second embodiment. First, the wavelength detector 28 detects the wavelength of the semiconductor laser 10. The wavelength controller 30 obtains the wavelength information 72 that corresponds to such detected wavelength from the wavelength detector 28. The wavelength controller 30 obtains drive current change information 76 from the output controller 20. The wavelength controller 30 obtains the wavelength correction information 80 that corresponds to drive current change information 78 from the second correction table 36. That is to say, (at a step of obtaining a wavelength correction amount) the output controller 20 obtains a wavelength correction amount (the wavelength correction information 80 in the second embodiment), which corresponds to an amount of correcting the change in the wavelength of the semiconductor laser 10, the change being generated when the drive current 66 calculated at the step of calculating the drive current described in the first embodiment is input.

Next, the wavelength controller 30 calculates the setting temperature information 74 with the use of the wavelength information 72 and the wavelength correction information 80 so as to set the wavelength of the semiconductor laser 10 at a desired value. The wavelength controller 30 outputs the temperature setting information 74 to the temperature setting apparatus 32. Lastly, the temperature setting apparatus 32 sets the temperature of the semiconductor laser 10 on the basis of the setting temperature information 74. That is to say, the wavelength controller 30 controls to suppress the change of the wavelength of the semiconductor laser 10 on the basis of such obtained wavelength correction amount (the wavelength correction information 80 in the second embodiment).

The wavelength information 72 includes current, voltage, or another type of signal that corresponds to the temperature detected by the wavelength detector 28. The setting temperature information 74 includes current, voltage, or another type of signal to set the temperature setting apparatus 32 at a desired temperature.

In the second embodiment, the wavelength controller 30 obtains the drive current change information 76 from the output controller 20, yet may obtain from the first correction table 34, for example. In addition, the drive current change information 78 may be identical to the drive current change information 76, yet may be the information processed by the wavelength controller 30 based on the drive current change information 76.

Figure 15:
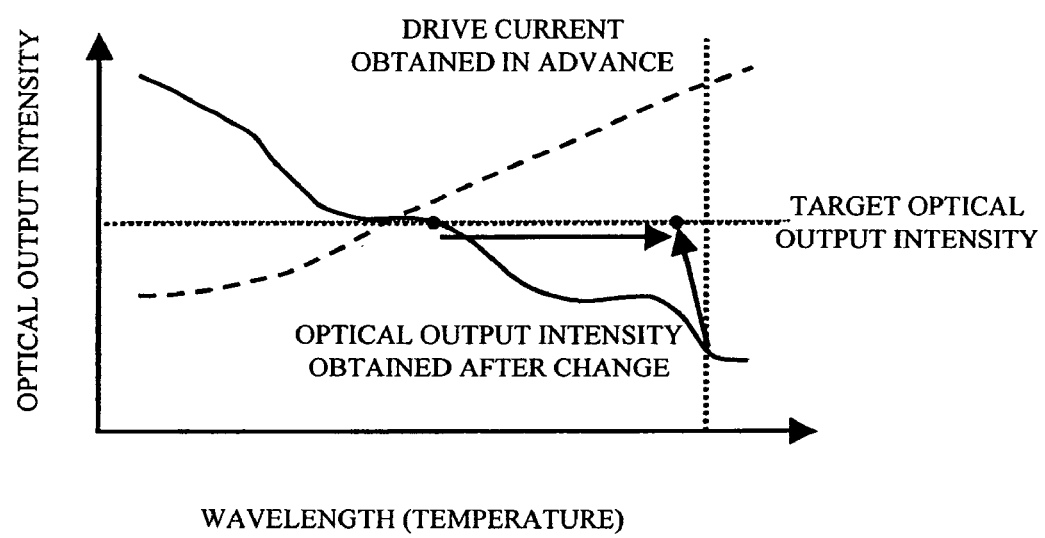
FIG. 15 is a graph showing relationship between the optical output intensity and the wavelength (temperature) in the semiconductor laser module in accordance with the second embodiment of the present invention, when the afore-mentioned semiconductor laser module is controlled.

FIG. 15 shows the relationship between the wavelength (namely, temperature) and the optical output intensity at the time of the afore-described control. When the wavelength is controlled to a target one, as shown in FIG. 15, such corrected wavelength is set to a target one by the wavelength correction information 80 (as indicated by arrows). The wavelength correction information 80 corresponds to the drive current change information 78. In other words, if the optical output intensity changes as the wavelength (temperature) changes, the drive current also changes. This changes the refractive index of the semiconductor laser, thereby changing the wavelength. The wavelength correction information 80 is provided for correcting the change in the wavelength. Consequently, a desired optical output intensity is obtainable at a target wavelength, by setting the temperature (wavelength) that corresponds to the temperature setting information 82, which is calculated by the wavelength information 72 and the wavelength correction information 80.

The drive current change information 78 is a change amount of the drive current, for example. The wavelength correction information 80 may include a wavelength drive current coefficient that corresponds to the change amount of the wavelength relative to the change amount of the drive current. By this, the setting temperature information 74 at the time of controlling the laser module can be calculated by the wavelength controller 30 to set the value, in which the change amount of the drive current is multiplied by the wavelength drive current coefficient, as a correction amount of the wavelength.

Next, a description will be given of a generation method of the control data in the second correction table 36. First, measurement is carried out to obtain the change amount in the drive current of the semiconductor laser 10 necessary for keeping the optical output intensity of the laser module constant. An example of the measurement system is shown in FIG. 6. The temperature of the semiconductor laser 10 is set by the temperature setting apparatus 32 via the laser temperature control monitoring device 103. At this setting temperature, the drive current that can obtain a desired optical output intensity is measured with the use of the laser APC power supply monitoring device 102. The afore-mentioned measurement is carried out at multiple setting temperatures to calculate the change amount in the drive current relative to the change amount in the temperature. At this time, the setting temperature of the semiconductor laser 10 may be employed. Alternatively, the temperature of the output optical system 12 detected by the temperature detecting element 22 may be employed.

The change amount in the wavelength of the semiconductor laser 10 is derived with respect to the change amount in the drive current (at a step of deriving a wavelength change amount). The wavelength correction information that corresponds to the correction amount of the wavelength of the semiconductor laser is calculated with the change amount of the wavelength. That is to say, the correction information in the wavelength controller 30 is obtained to correct the change amount of the wavelength. The correction table is created for drive current change information that corresponds to a change amount in the drive current and the wavelength correction information.

At the step of deriving the wavelength change amount, the change amount in the wavelength of the semiconductor laser may be calculated with the change amount in the refractive index, which is calculated by the change amount in the refractive index in the semiconductor laser 10 with the drive current change information that corresponds to the change amount of the drive current. This makes it possible to create the correction table without measuring the wavelength.

In addition, at the step of deriving the wavelength change amount, the measurement may be carried out to obtain the change amount in the wavelength of the semiconductor laser 10 that corresponds to the change amount in the drive current. An example of the measurement system is shown in FIG. 6. The temperature of the semiconductor laser 10 is set by the temperature setting apparatus 32 via the laser temperature control monitoring device 103. At this setting temperature, the drive current is set by the with the use of the laser APC power supply monitoring device 102 to drive the semiconductor laser 10. The wavelength is measured with the use of the wavelength measuring device 104 or the wavelength detector 28. The wavelength is measured in multiple drive currents, and the change amount of the wavelength is calculated with respect to the change amount in the drive current. That is to say, the change amount in an emission wavelength of the semiconductor laser 10 is obtained. The change amount in the emission wavelength of the semiconductor laser 10 is generated when the output controller 20 corrects the drive current of the semiconductor laser 10, on the basis of the optical output intensity correction information. This makes it possible to calculate the change amount in the wavelength with accuracy.

The data (control data) of the second correction table that has been created as described heretofore includes the correction information of the wavelength controller 30, which is provided for correcting the change amount of the emission wavelength of the semiconductor laser 10 that is generated by correcting the drive current of the semiconductor laser 10 on the basis of the optical output intensity correction information. The afore-mentioned control data is stored in a memory storage medium such as a memory IC, floppy disk, or the like. The control data may be stored in a specific memory IC, for example, a memory IC in a semiconductor laser module into which writing is allowed. This makes it possible to prevent of the misuse by mistaking for another correction table of another semiconductor laser module. Moreover, as described in the first embodiment, the control data may be stored in an identical storage medium that includes the first correction table data or tuning table.

Figure 16:
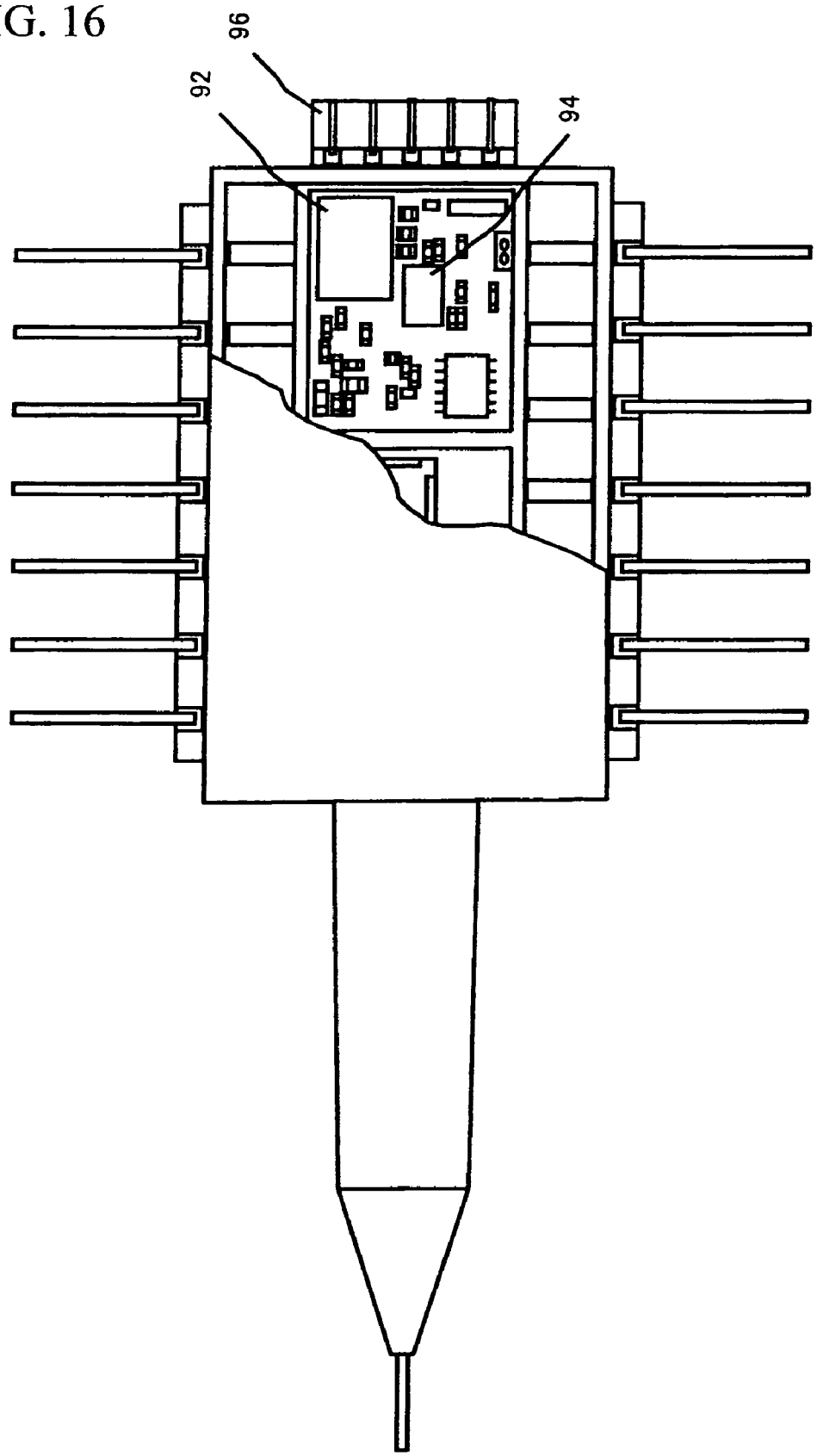
FIG. 16 schematically shows a semiconductor laser module in accordance with the second embodiment of the present invention.

FIG. 16 schematically shows a semiconductor laser module in accordance with the second embodiment of the present invention. The semiconductor laser module in accordance with the second embodiment includes a CPU 94, a memory IC 92, and an input/output port 96. The CPU 94 performs functionalities of the output controller 20 and the wavelength controller 30. The memory IC 92 stores the first correction table 34 and the second correction table 36. The input/output port 96 reads and writes data, when the first correction table 34 or the second correction table 36 is created. In this manner, the output controller 20 and the wavelength controller 30 may be operated by an identical CPU, or may be operated by different CPUs. The first correction table 34 and the second correction table 36 may be stored in an identical memory, or may be stored in different memories.

Figure 17:
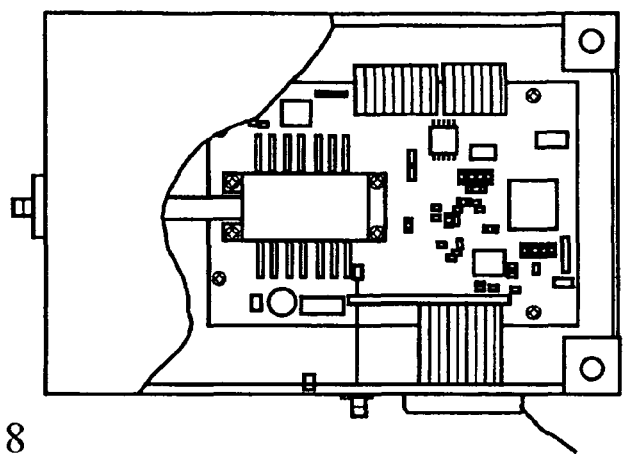
FIG. 17 schematically shows a semiconductor laser module in accordance with a variation example of the second embodiment.

FIG. 17 schematically shows a semiconductor laser module in accordance with a variation example of the second embodiment. The semiconductor laser module includes a communication port (input/output terminal) 98 provided for inputting and outputting the data with the first correction table 34 and the second correction table 36 that are externally provided. As described, the first correction table 34 and the second correction table 36 may not be included in the semiconductor laser module, and the optical output intensity correction information 70 that corresponds to the temperature information 64 and the wavelength correction information 80 that corresponds to the drive current change information 78 may be input and output by means of the first correction table 34 and the second correction table 36 that are externally provided.

Alternatively, the semiconductor laser module may include any one of the first correction table 34 and the second correction table 36, and may input and output any one of the optical output intensity correction information 70 that corresponds to the temperature information 64 and the wavelength correction information 80 that corresponds to the drive current change information 78, via the input/output terminal 98.

That is to say, the input/output terminal 98 may be provided for obtaining the optical output intensity correction information 70 that corresponds to the temperature information 64, and the output controller 20 may externally obtain the optical output intensity correction information 70 that corresponds to the temperature information 64 via the input/output terminal 98. Alternatively, the input/output terminal 98 may be provided for obtaining the wavelength correction information 80 that corresponds to the drive current change information 78, and the wavelength controller 30 may externally obtain the optical output intensity correction information 70 that corresponds to the drive current change information 78 via the input/output terminal 98.

As described, in the second embodiment, when the wavelength of the semiconductor laser 10 is controlled, the wavelength controller 30 obtains the drive current change information 78 that corresponds to the change amount of the drive current. The wavelength controller 30 uses the wavelength correction information 80 that corresponds to the drive current change information 78 to calculate the setting temperature information 74, and outputs the setting temperature information 74 to the temperature setting apparatus 32. This makes it possible to control the wavelength appropriately when the wavelength is controlled.

Third Embodiment

Figure 18:
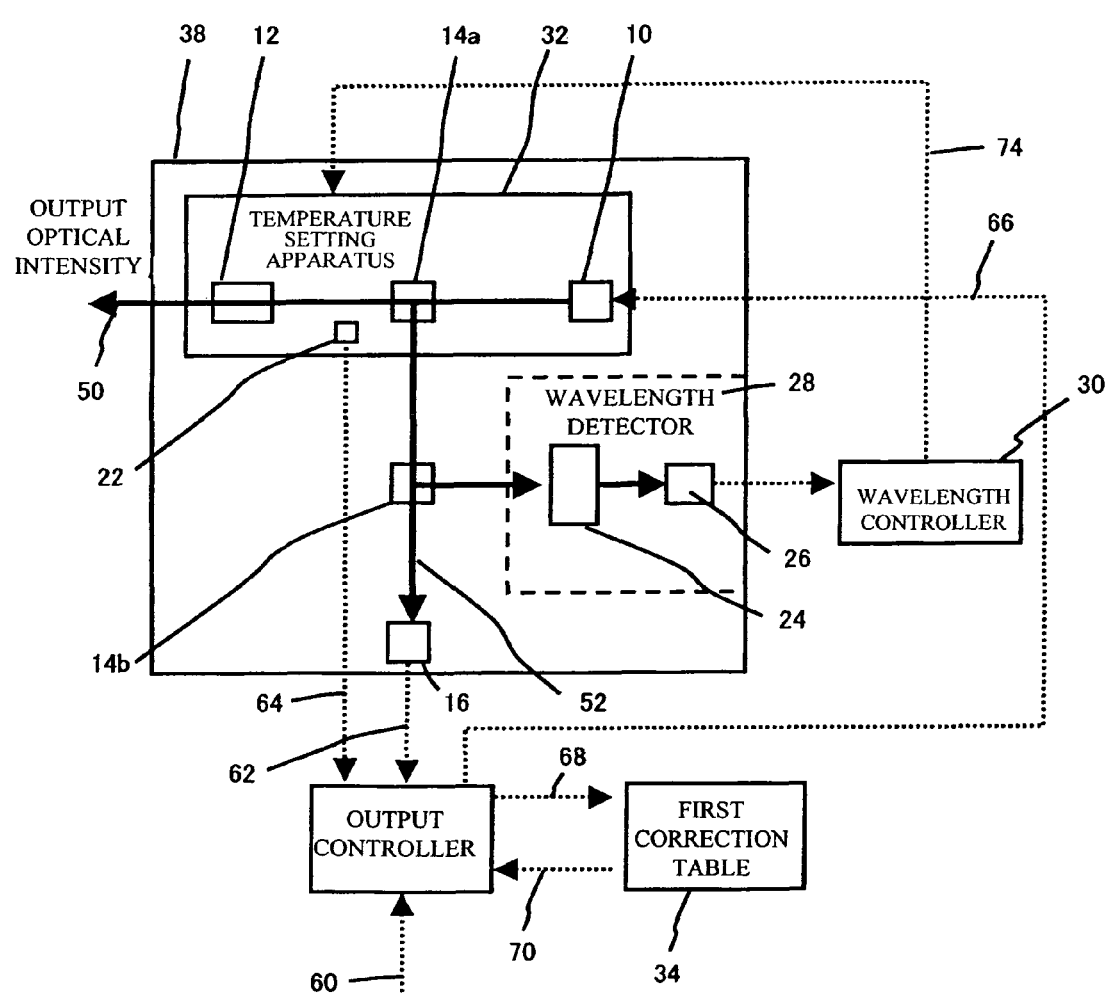
FIG. 18 is a block diagram of the semiconductor laser module in accordance with a third embodiment of the present invention.

A third embodiment of the present invention exemplarily describes a semiconductor laser module having a wavelength locker that monitors the monitor optical intensity on the front side (optical output side) of the semiconductor laser. FIG. 18 is a block diagram of the semiconductor laser module in accordance with a third embodiment of the present invention. The light receiving element 16 receives the light emitted to the front side. Except the light receiving element 16, hereinafter, in the third embodiment, the same components and configurations as those of the first embodiment have the same reference numerals. The beam emitted from the semiconductor laser 10 passes through a beam splitter 14a, and further passes through the output optical system 12, and is externally output as the optical output intensity 50.

The beam split by the beam splitter 14a passes through another beam splitter 14b and is split into two. One of such split beam reaches the light receiving element 16 and the monitor optical intensity is detected by the light receiving element 16. That is, the light receiving element 16 receives the beam provided on an opposite side of the optical output side. The light receiving element 16 outputs the monitor optical intensity 52 to the output controller 20 as the monitor optical intensity information 62. The configurations and control method in which the output controller 20 controls the drive current 66 to be output to the semiconductor laser 10, in accordance with the third embodiment is same as those in accordance with the first embodiment.

The other split beam reaches the wavelength detector 28. The configurations and control method in which the wavelength controller 30 controls the temperature of the semiconductor laser 10, in accordance with the third embodiment is same as those in accordance with the first embodiment. Also, the configurations and control method in accordance with the second embodiment may be employed with the drive current change information 76.

If the optical intensity on the optical output side is monitored as described in the third embodiment, it may sound that the control method in accordance with the present invention is not necessary. However, the output optical system 12 is arranged on the optical output side when viewed from the beam splitter 14a. The distortion of the output optical system 12 due to the change in the temperature changes the optical output intensity 50. It is difficult to arrange the output optical system 12 between the beam splitter 14a and the semiconductor laser 10, because an optical system such as a lens and an optical fiber establish an optical coupling.

For this reason, in accordance with the third embodiment, the first correction table 34 stores, in advance, the temperature information 64 that corresponds to the temperature of the output optical system and the optical output intensity correction information 70 that corresponds to the temperature information. At the time of operation, the output controller 20 obtains the optical output intensity correction information 70 that corresponds to the temperature information 64 of the output optical system, calculates the drive current 66 to be output to the semiconductor laser, and outputs the drive current 66 to the semiconductor laser. This makes it possible to obtain a constant optical output intensity even if the temperature changes (wavelength changes).

In the semiconductor laser module having the wavelength locker that monitors the monitor optical intensity on the front side (optical output side) of the semiconductor laser, as described in the third embodiment, it is possible to correct the wavelength at the time of controlling the wavelength as described in the second embodiment. In this manner, also in the third embodiment, the same effect is obtainable as described in the second embodiment.

Fourth Embodiment

Figure 19:
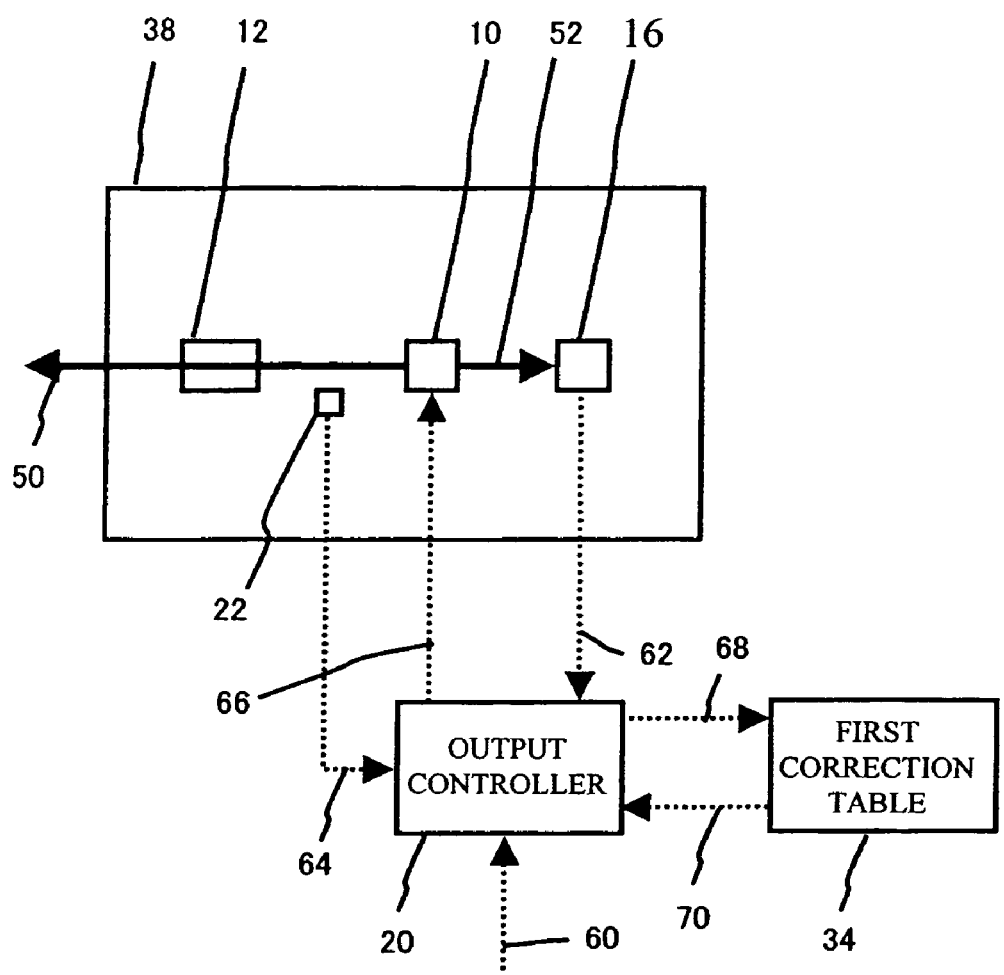
FIG. 19 is a block diagram of a semiconductor laser module without a temperature controller in accordance with the fourth embodiment of the present invention.

A fourth embodiment of the present invention exemplarily describes a semiconductor laser module without a temperature controller, in which the temperature is not controlled. FIG. 19 is a block diagram of a semiconductor laser module without a temperature controller in accordance with the fourth embodiment of the present invention. In the fourth embodiment, the wavelength is not controlled. Therefore, as compared to the configuration in accordance with the first embodiment, the beam splitter 14, the wavelength detector 28, the wavelength controller 30, and the temperature setting apparatus 32, which are provided for detecting and controlling the wavelength, are not provided in the fourth embodiment. That is to say, the beam emitted from the rear side of the semiconductor laser 10 directly reaches the light receiving element 16. The light receiving element 16 detects the monitor optical intensity 52 and outputs the monitor optical intensity information 62 to the output controller 20. The output controller 20 has the same configuration and method as those of the first embodiment so as to control the drive current 66 to be output to the semiconductor laser 10.

The semiconductor laser 10 in which the temperature is not controlled changes the optical output intensity 50, as the output optical system 12 changes due to ambient temperature. So, in accordance with the fourth embodiment, the first correction table 34 stores, in advance, the temperature information 64 that corresponds to the temperature of the output optical system 12 and the optical output intensity correction information 70 that corresponds to the temperature information 64. At the time of operation, the output controller 20 obtains the optical output intensity correction information 70 that corresponds to the temperature information 64 of the output optical system, calculates the drive current 66 to be output to the semiconductor laser 10, and outputs the drive current 66 to the semiconductor laser 10. This makes it possible to obtain a constant optical output intensity, even if the temperature of the output optical system 12 changes due to the change in ambient temperature.

In accordance with the present invention, there is provided a laser module including: a semiconductor laser; an output optical system provided on a optical output side of the semiconductor laser; a temperature detecting element that detects a temperature of the output optical system; and an output controller that calculates a drive current to set an optical output intensity of the laser module at a desired value on the basis of temperature information obtained by the temperature detecting element, and outputs the drive current to the semiconductor laser.

The afore-described laser module may further include a first correction table that includes optical output intensity correction information that corresponds to the temperature information. The output controller may obtain the optical output intensity correction information that corresponds to the temperature information from the first correction table, and calculates the drive current to set the optical output intensity of the laser module at the desired value with the optical output intensity correction information. In accordance with the present invention, the output controller is capable of calculating the drive current by including the first correction table having the optical output intensity correction information that corresponds to the temperature information.

The afore-described laser module may further include an input/output terminal to obtain optical output intensity correction information that corresponds to the temperature information. The output controller may externally obtain the optical output intensity correction information that corresponds to the temperature information via the input/output terminal, and calculates the drive current to set the optical output intensity of the laser module at the desired value with the optical output intensity correction information. In accordance with the present invention, the output controller is capable of calculating the drive current easily, by including the input/output terminal to obtain the optical output intensity correction information that corresponds to the temperature information.

The afore-described laser module may further include a light receiving element that detects a monitor optical intensity. The output controller may calculate the drive current to set the optical output intensity of the laser module at the desired value with monitor optical intensity correction information that corresponds to the monitor optical intensity and the temperature information. In accordance with the present invention, it is possible to provide the laser module in which the optical output intensity does not change, even in the laser module having the light receiving element that outputs the monitor optical intensity information to the output controller.

In the afore-described laser module, the light receiving element may receive a light emitted from any one of the optical output side and an opposite side thereof. The light receiving element may receive the light split by a beam splitter.

In the afore-described laser module, the temperature detecting element may be provided on a substrate onto which the output optical system is secured. The temperature detecting element may also serve as an element that detects the temperature of the semiconductor laser. The temperature detecting element may be provided close to the output optical system.

The afore-described laser module may further include a wavelength controller that controls a wavelength of the semiconductor laser. The wavelength controller may obtain a wavelength change amount of the semiconductor laser, the wavelength change amount being generated as the output controller changes the drive current that is output to the semiconductor laser, and controls to suppress a change in the wavelength of the semiconductor laser on the basis of the wavelength change amount obtained. In accordance with the present invention, the change in the wavelength caused by the change in the drive current of the semiconductor laser is controlled by the wavelength correction information. It is therefore possible to control the wavelength for sure.

The afore-described laser module may further include a second correction table that includes wavelength correction information that corresponds to the change in the drive current of the semiconductor laser. The wavelength controller may obtain the wavelength change amount of the semiconductor laser that corresponds to the change in the drive current that is output by the output controller to the semiconductor laser, on the basis of the second correction table. The wavelength controller is capable of calculating the setting temperature information easily, by including the second correction table that includes the wavelength correction information that corresponds to the change in the drive current.

The afore-described laser module may further include an input/output terminal to obtain the wavelength correction information. The wavelength controller may externally obtain the wavelength correction information via the input/output terminal. In accordance with the present invention, the wavelength can be controlled for sure. The wavelength controller is capable of calculating the setting temperature information with ease, by including the input/output terminal that obtains the wavelength correction information that corresponds to the change of the drive current.

In accordance with the present invention, the output optical system distorts due to the change in the temperature of the semiconductor laser or the module thereof. Accordingly, by correcting the afore-described change, it is possible to provide a laser module, a control method, control data, and a generation method of the control data, in which the optical output intensity does not change, even if the temperature of the semiconductor laser or the laser module having the semiconductor laser changes.

The present invention is not limited to the above-mentioned embodiments, and other embodiments, variations and modifications may be made without departing from the scope of the present invention.

The present invention is based on Japanese Patent Application No. 2005-105488 filed on Mar. 31, 2005, the entire disclosure of which is hereby incorporated by reference.

What is claimed is:

1. A laser module comprising:
   a semiconductor laser;
   an output optical system provided on an optical output side of the semiconductor laser;
   a temperature detecting element that detects a temperature of the output optical system;
   a first correction table that includes optical output intensity correction information based on temperature information of the output optical system,
   a light receiving element that detects a monitor optical intensity of the semiconductor laser; and
   an output controller that calculates a drive current to set an optical output intensity of the laser module at a desired value based on the optical output intensity correction information which is based on the temperature information obtained from the first correction table, and monitor optical intensity information which is based on the monitor optical intensity obtained from the light receiving element, and outputs the drive current to the semiconductor laser.

2. The laser module as claimed in claim 1,
   wherein the optical output intensity correction information is information for correcting a variation of a loss of a light that passes through the optical output system, the variation is caused by a variation of the temperature of the output optical system.

3. The laser module as claimed in claim 1, further comprising an input/output terminal to obtain optical output intensity correction information that corresponds to the temperature information,
   wherein the output controller externally obtains the optical output intensity correction information that corresponds to the temperature information via the input/output terminal, and calculates the drive current to set the optical output intensity of the laser module at the desired value with the optical output intensity correction information.

4. The laser module as claimed in claim 1, wherein the light receiving element receives a light emitted from any one of the optical output side and an opposite side thereof.

5. The laser module as claimed in claim 4, wherein the light receiving element receives the light split by a beam splitter.

6. The laser module as claimed in claim 1, wherein the temperature detecting element is provided on a substrate onto which the output optical system is secured.

7. The laser module as claimed in claim 1, wherein the temperature detecting element also serves as an element that detects the temperature of the semiconductor laser.

8. The laser module as claimed in claim 1, wherein the temperature detecting element is provided near the output optical system.

9. The laser module as claimed in claim 1, further comprising a wavelength controller that controls a wavelength of the semiconductor laser,
   wherein the wavelength controller obtains a wavelength change amount of the semiconductor laser, the wavelength change amount being generated as the output controller changes the drive current that is output to the semiconductor laser, and controls to suppress a change in the wavelength of the semiconductor laser on the basis of the wavelength change amount obtained.

10. The laser module as claimed in claim 9, further comprising a second correction table that includes wavelength correction information that corresponds to the change in the drive current of the semiconductor laser,
wherein the wavelength controller obtains the wavelength change amount of the semiconductor laser that corresponds to the change in the drive current that is output by the output controller to the semiconductor laser, on the basis of the second correction table.

11. The laser module as claimed in claim 9, further comprising an input/output terminal to obtain the wavelength correction information, wherein the wavelength controller externally obtains the wavelength correction information via the input/output terminal.

12. A control method of a laser module including a semiconductor laser, an output optical system provided on an optical output side of the semiconductor laser, a temperature detecting element that detects a temperature of the output optical system and a light receiving element that detects a monitored optical intensity of the semiconductor laser, the control method comprising:
detecting the temperature of the output optical system;
detecting the monitored optical intensity of the semiconductor laser; and
calculating a drive current to set an optical output intensity of the laser module at a desired value based on the optical output intensity correction information which is based on temperature information of the output optical system obtained from a first correction table, and monitored optical intensity information which is based on the monitored optical intensity; and
driving the semiconductor laser with the drive current.

13. The control method as claimed in claim 12, wherein the optical output intensity correction information is information for correcting a variation of a loss of a light that passes through the optical output system, the variation is caused by a variation of the temperature of the output optical system.

14. The control method as claimed in claim 12, wherein the laser module further includes a wavelength controller that controls a wavelength of the semiconductor laser;
further comprising the steps of:
obtaining a wavelength correction amount to correct a change in the wavelength of the semiconductor laser, the change being generated as the drive current calculated at the step of calculating the drive current is input; and
controlling by the wavelength controller to suppress the change in the wavelength of the semiconductor laser on the basis of the correction amount obtained.

15. The control method as claimed in claim 14, wherein the step of obtaining the wavelength correction amount obtains the wavelength correction amount from a second table that includes wavelength correction information that corresponds to the change in the drive current of the semiconductor laser.

16. A semiconductor laser comprising:
a semiconductor laser;
an output optical system provided on an optical output side of the semiconductor laser;
a temperature detecting element that detects a temperature of the output optical system and provides temperature information for correcting an optical output intensity of a laser module;
a first correction table that includes optical output intensity correction information based on temperature information of the output optical system; and
a light receiving element that detects a monitored optical intensity of the semiconductor laser,
an output controller that calculates a drive current to set an optical output intensity of the laser module at a desired value based on the optical output intensity correction information which is based on the temperature information obtained from the first correction table, and monitored optical intensity information which is based on the monitored optical intensity obtained from the light receiving element, and outputs the drive current to the semiconductor laser.

17. The laser module as claimed in claim 1, wherein the optical output intensity correction information is control data for correcting a difference in the optical output intensity before and after a temperature of the output optical system changes.

18. The control method as claimed in claim 12, wherein the optical output intensity correction information is control data for correcting a difference in the optical output intensity before and after a temperature of the output optical system changes.

19. The semiconductor laser as claimed in claim 16, wherein the optical output intensity correction information is control data for correcting a difference in the optical output intensity before and after a temperature of the output optical system changes.

* * * * *